(12) United States Patent
Matsubara

(10) Patent No.: US 7,005,843 B2
(45) Date of Patent: Feb. 28, 2006

(54) POSITION INDICATOR AND POSITION DETECTOR

(75) Inventor: Masaki Matsubara, Tokyo-to (JP)

(73) Assignee: Wacom Co., Ltd., Saitama-ken (JP)

( * ) Notice: Subject to any disclaimer, the term of this patent is extended or adjusted under 35 U.S.C. 154(b) by 0 days.

(21) Appl. No.: 10/999,113

(22) Filed: Nov. 30, 2004

(65) Prior Publication Data

US 2005/0127893 A1 Jun. 16, 2005

(30) Foreign Application Priority Data

Dec. 3, 2003 (JP) ............................. 2003-404961

(51) Int. Cl.
*G01R 17/16* (2006.01)
*G01R 27/26* (2006.01)

(52) U.S. Cl. .................................. 324/76.67; 324/678

(58) Field of Classification Search ............ 324/76.67, 324/76.66, 76.52, 76.39, 76.11, 661, 658, 324/649, 600, 678, 382, 207.13, 207.15, 324/207.22, 207.23, 207.25; 73/54.33, 854, 73/862.392
See application file for complete search history.

(56) References Cited

U.S. PATENT DOCUMENTS

| | | | | |
|---|---|---|---|---|
| 4,127,881 A | * | 11/1978 | Wakami et al. | ............... 360/70 |
| 5,327,078 A | * | 7/1994 | Mori | ...................... 324/207.24 |
| 5,561,375 A | * | 10/1996 | Porcher | ................. 324/207.16 |
| 5,694,051 A | * | 12/1997 | Ueyama et al. | ............. 324/768 |
| 5,841,273 A | * | 11/1998 | Muraji | .................. 324/207.17 |
| 6,291,989 B1 | * | 9/2001 | Schroeder | .............. 324/207.21 |

* cited by examiner

*Primary Examiner*—Vincent Q. Nguyen
*Assistant Examiner*—Hoai-An D. Nguyen
(74) *Attorney, Agent, or Firm*—Berenato, White & Stavish, LLC

(57) ABSTRACT

A position indicator includes a time-constant circuit having an element whose characteristic continuously varies in response to operation represented as a continuous quantity such as writing force, and capable of switching the variation range of time constant in response to the variation in characteristic of the element in at least two ways; and a discharging/charging device capable of discharging the time-constant circuit from a predetermined voltage to a voltage below a specified voltage, or charging the time-constant circuit from the predetermined voltage to a voltage exceeding the specified voltage. Using the time-constant circuit and discharging/charging device, the number of waves of AC signals at a specified frequency is counted from the discharge start time to the time when the voltage falls below the specified voltage, or from the charge start time to the time when the voltage exceeds the specified voltage, by switching the variation range of time constant.

12 Claims, 9 Drawing Sheets

POSITION INDICATOR AND POSITION DETECTOR

CROSS-REFERENCE TO RELATED APPLICATIONS AND CLAIM TO PRIORITY

This application claims the benefit of priority under 35 U.S.C. § 119 of application number 2003-404961, filed Dec. 3, 2003 in Japan, the disclosure of which is incorporated herein by reference.

1. Field of the Invention

The present invention relates to a position indicator and a position detector using the same. More specifically, the present invention pertains to a position indicator that encodes information corresponding to an operation represented as a continuous quantity, such as writing force, and that transfers it to a tablet, and the improvement in the position detector using the position indicator.

2. Background of the Invention

Conventionally, a position indicator can encode information corresponding to an operation represented as a continuous quantity without using an A/D converter and can transfer it to the tablet. A position indicator converts the information corresponding to an operation represented as a continuous quantity into the length of time, and encodes the continuous quantity by counting the number of alternating current electromagnetic waves transmitted from the tablet during the converted time, and transfers the operational information by varying alternating current electromagnetic waves to be sent back to the tablet side in accordance with the codes (Japanese Unexamined Patent Application Publication 7-175572).

When encoding the length of time by counting the number of waves of alternating current signals, such as alternating current electromagnetic waves transmitted from the tablet, enhancing the accuracy (resolution) of encoding requires an increase in the number of waves of alternating current signals per unit time, i.e., an increase in the frequency of the alternating current signals, or an elongation of the length of time to be counted.

However, enhancing the frequency of the alternating current signals requires expensive circuit elements, which causes a rise in the product cost and incurs an increase in power consumption. This undesirably negates the intrinsic advantage of the above-described position indicator that it does not have to use an A/D converter having large power consumption.

On the other hand, elongation of the length of time has a problem of causing a reduction in the detection frequency (reading speed) with respect to operational information or positional information including a continuous quantity.

SUMMARY OF THE INVENTION

Accordingly, it is an object of the present invention to solve these problems and provide a position indicator and a position detector using the same that are capable of detecting operation information, including positional information, represented as a continuous quantity with higher resolution without reducing the detection frequency.

According to one aspect of the present invention, a position indicator comprises:

a time-constant circuit that includes an element of which the characteristic continuously varies in response to an operation represented as a continuous quantity, and that can switch the variation range of a time constant in response to the variation in the characteristic of the element in at least two ways; discharging/charging device capable of discharging the time-constant circuit from a predetermined voltage to a voltage below a specified voltage, or charging the time-constant circuit from the predetermined voltage to a voltage exceeding the specified voltage; and a time-constant setting device that, during the period from the time of a discharge start to the time when the voltage falls below the specified voltage, or from the time of a charge start to the time when the voltage exceeds the specified voltage, switches the time constant in at least two ways for setting; a counting device that counts the number of waves of alternating current signals at a specified frequency, over the period from the time of a discharge start to the time when the voltage falls below the specified voltage, or from the time of a charge start to the time when the voltage exceeds the specified voltage, for every period during which the variation range of the time constant is switched; and a calculating device that, on the basis of the ratio between the count value of alternating current signals at the specified frequency during each of the periods and the variation range of the time constant during each of the periods, determines a count value corresponding to that in the case where the variation range of the time constant in the all periods is assumed to be the largest variation range of the time constant out of at least two ways of variation ranges of the time constant, and that takes the count value as a code.

In the above-described arrangements, because the element characteristic varies in response to the operation represented as the continuous quantity, a time constant of the time-constant circuit, e.g., "a", is determined. Under this time constant "a", a discharge or a charge from a predetermined voltage in the time-constant circuit is started by the discharging/charging device, and the number of alternating current signals at the specified frequency starts to be counted by the counting device. The technique in which such a discharge or charge continues to be performed up to a specified voltage (threshold value) as they are, and in which the counting by the counting device is stopped, is through conventional techniques. In this invention, however, the variation range of the time constant is changed by the time-constant setting device during the counting phase, and thereby the time constant of the time-constant circuit is changed to, e.g., "b", and the discharge or the charge is further continued. Here, the variation range before and after the change is set so that the time-constant "b" is sufficiently large as compared with the time-constant "a".

According to the above-described features, it is possible to achieve a resolution equivalent to that obtained in the case where the counting is performed using the time constant "b", and also to complete counting in a shorter time than the case where the counting is performed only by the time constant "b", by the length of the time spent for the discharge or the charge by the time constant "a". Even if there are provided three or more variations ranges of the time constant settable by the time-constant setting device, similar detection can be achieved.

The timing for switching and setting the variation range of the time constant by the time-constant setting device may be the point in time when a predetermined time has elapsed after a discharge or a charge has been started. However, in order to reduce the detection time, it is desirable that the above-described timing be immediately before the discharge or the charge based on the variation range provided by the time constant "a" arrives at the threshold value. Therefore, previously performing a detection based on the variation range providing the time constant "a", and detecting the time when the discharge or the charge arrives at the threshold value, allows the above-describing timing to be determined.

From the count value during the period when a discharge or a charge based on the variation range providing the time constant "a" is performed, the count value during the period before the voltage arrives at the threshold value by the discharge or the charge after the time constant has been set to the variation range providing time constant "b" by the time constant setting device, and the ratio between the variation range providing the time constant "a" and the variation range providing the time constant "b", it is possible to obtain information of a continuous quantity with the same resolution as in the case where the detection is performed by the time constant "b" by the calculating device.

Also, in the position indicator according to the present invention, a time-constant circuit is used that includes an element of which the characteristic continuously varies in response to an operation represented as a continuous quantity, and that can switch the variation range of the time constant in response to the variation in the characteristic of the element in n (n: natural number not less than 2) ways in each of which the characteristic varies by a factor of $2^N$; (N: natural number not less than 1). That is, a time-constant circuit in which the variation range itself of the time constant has binary-coded information. Moreover, a counting device that measures a specified unit time by counting a predetermined number of waves of alternating current signals at a specified frequency is employed. Furthermore, the variation range for every pertinent unit time is switched and set by the time-constant setting device and out of the variation ranges of time constant from the smallest one to the largest one, combinations of variation ranges necessary for discharging the time-constant circuit from a predetermined voltage to a voltage below a specified voltage or charging the time-constant circuit from the predetermined voltage to a voltage exceeding the specified voltage are extracted. By virtue of these features, the present invention eliminates the need to perform calculation processing in accordance with the ratio between variation ranges of a plurality of time constants.

As an element of which the characteristic varies in response to an operation represented as an continuous quantity, a variable capacitor of which the capacity value continuously varies can be employed. In this case, the time-constant circuit includes a variable capacitor and a plurality of resistors. The variation range of the time constant can be switched by switching and connecting one of the resistors to the variable capacitor.

As described above, according to the present invention, the detection of operation information represented as a continuous quantity can be performed in a short time and with high resolution.

DESCRIPTION OF THE PREFERRED EMBODIMENT(S)

Figure 1:
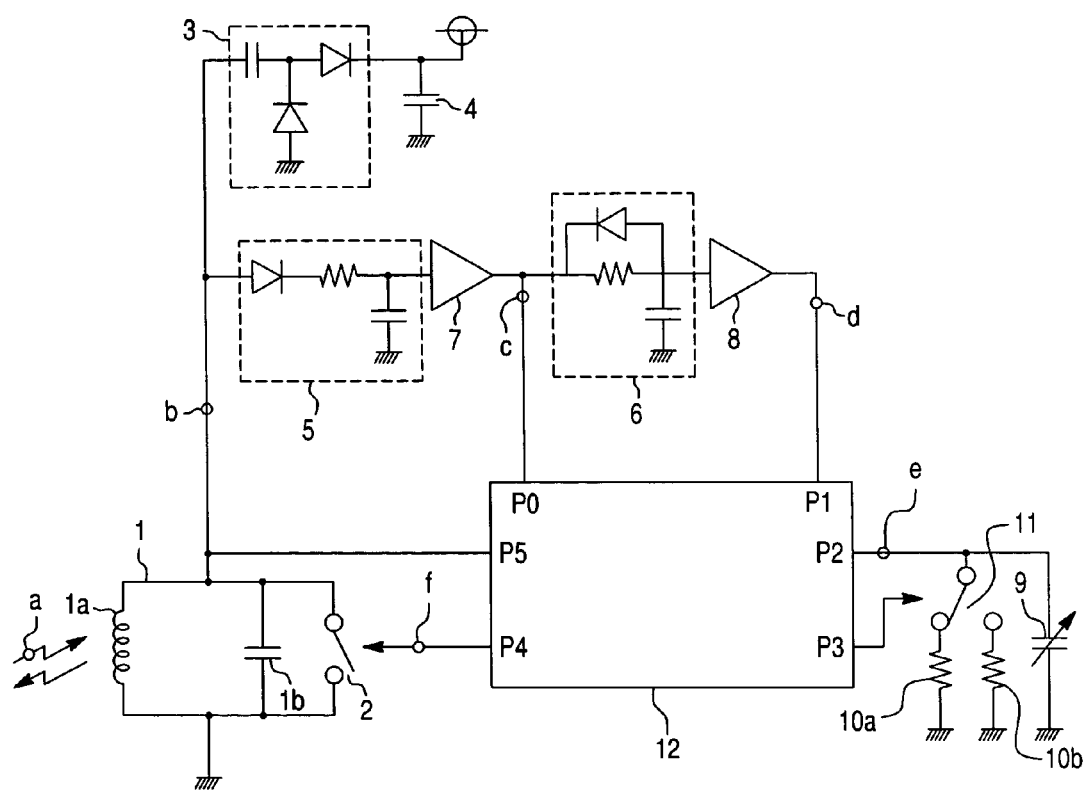
FIG. 1 is a block diagram of a position indicator according to a first embodiment of the present invention.

FIG. 1 shows a position indicator according to a first embodiment of the present invention. In FIG. 1, reference numeral 1 denotes a resonant circuit; 2 a switch; 3 a power source extraction circuit; 4 a capacitor for a power source; 5 a detector circuit; 6 an integration circuit; 7 and 8 denote buffers; 9 denotes a variable capacitor; 10a and 10b are resistors; 11 denotes a changeover switch; and 12 is a microcomputer.

The resonant circuit 1 comprises a coil 1a and capacitor 1b, and has a resonant frequency substantially the same as the frequency $f_0$ of electromagnetic waves transmitted from a tablet (not shown). The switch 2 is on/off controlled by the microcomputer 12, and changes the characteristic of the resonant circuit 1 by changing over the opposite terminals of the capacitor 1b to open or short circuit conditions. Here, the switch 2 changes the signal to be transmitted to the tablet side by changing over the resonant circuit 1 to an acting condition or a non-acting condition, that is, to a state with a signal or a state without a signal. The power source extraction circuit 3 rectifies the induced voltage of an alternating current generated in the resonant circuit 1, then stores it in the capacitor 4 as a power source, and supplies the power source to the buffers 7 and 8 and the microcomputer 12.

The detector circuit 5 and the buffer 7 supply the integration circuit 6 and the microcomputer 12 with a pulse signal corresponding to the envelope component of a signal generated in the resonant circuit 1 by electromagnetic waves transmitted from the tablet. Only after signals from the detector circuit 5 and the buffer 7 continue for at least a specified time period, the integration circuit 6 and the buffer 8 start up the output and supply the signals to the microcomputer 12.

In the variable capacitor 9, its capacitance value continuously varies in response to an operation represented as a continuous quantity, which is here a writing force in the position indicator. The resistors 10a and 10b have different resistance values from each other. Here, the resistor 10b has a sufficiently large resistance value as compared with that of the resistor 10a. The changeover switch 11 is switching-controlled by the microcomputer 12, and switches and connects either one of the resistors 10a and 10b to the opposite ends of the variable capacitor 9.

The above-described variable capacitor 9, the resistors 10a and 10b, and the changeover switch 11 constitute the time-constant circuit of the present invention.

The microcomputer 12 is a well-known microcomputer, which includes a ROM and a RAM, and which operates in accordance with programs written in the ROM.

In general, the microcomputer has a plurality of input/output terminals, and can arbitrarily set these terminals by the programs written in the ROM. In this embodiment, as best shown in FIG. 1, out of the input/output terminals provided in the microcomputer 12, six are employed.

Specifically, terminal P0 is set as an input terminal, and supplies signals from the buffer 7. Terminal P1 is also set as an input terminal, and supplies signals from the buffer 8. Terminal P2 is connected to the variable capacitor 9, and set as an output terminal to charge the variable capacitor 9. Concurrently, the terminal 2 is set as an input terminal to detect the voltage of the variable capacitor 9 (time-constant circuit). Terminal P3 is set as an output terminal, and connected to the changeover switch 11 to on/off control the changeover switch 11. Terminal P4 is set as an output terminal, and connected to the switch 2 to on/off control the switch 2. Also, terminal P5 is set as an input terminal, and connected to the resonant circuit 1. Terminal 5 counts the number of waves of transmission signals of the tablet, obtained from the resonant circuit 1, using an incorporated timer (counter).

Next, operation of the position indicator with these features, according to the first embodiment will be described. FIGS. 2A to 2F are waveform diagrams showing operation of the first embodiment. Here, symbols "a" to "f" in FIGS. 2A to 2F denote signal waveforms of the respective portions denoted by the same symbols as those in FIG. 1.

Figure 2:
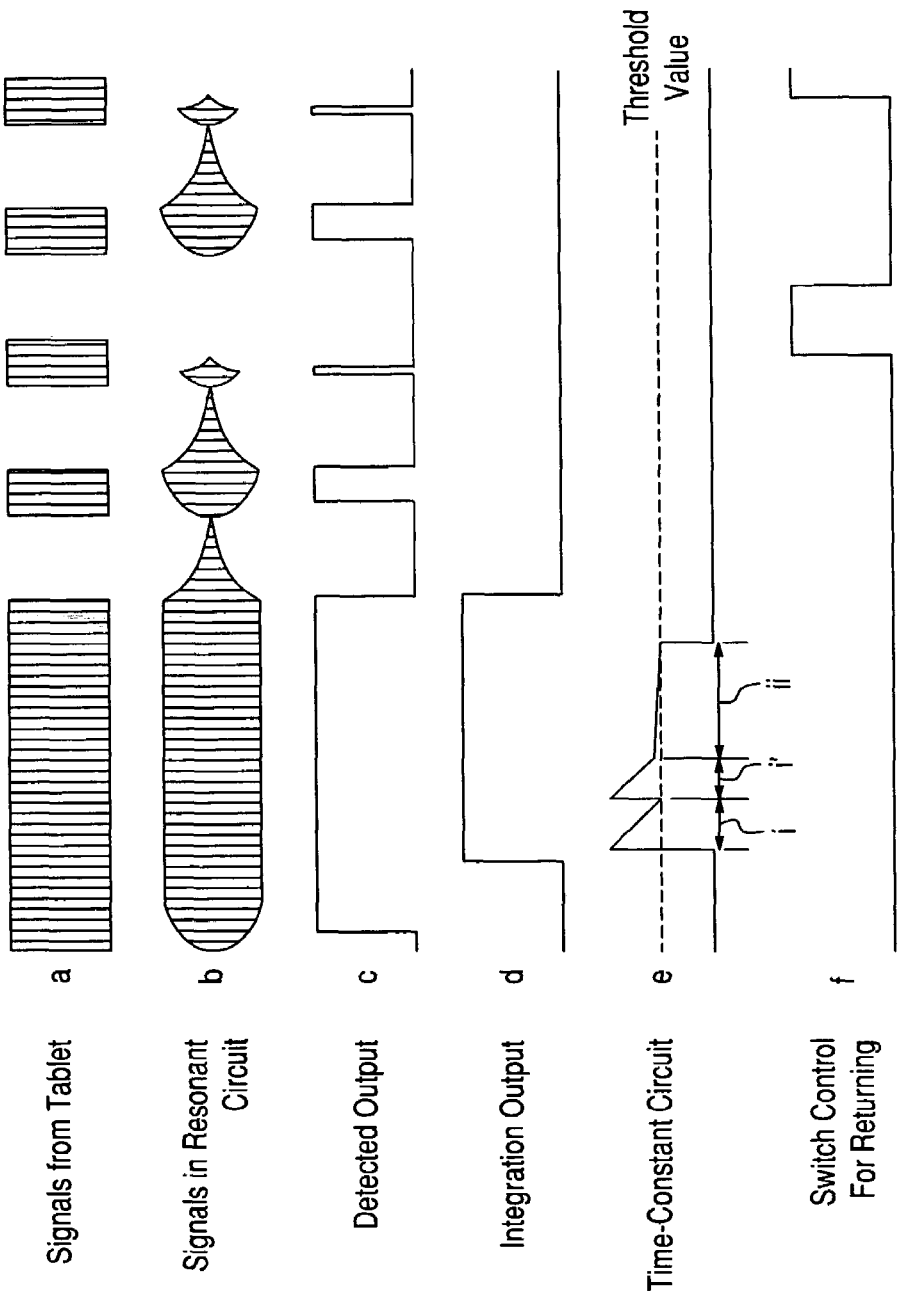
FIGS. 2A to 2F are waveform diagrams showing operations in the first embodiment.

From a tablet for detecting operation information represented as a continuous quantity in the position indicator, electromagnetic waves are transmitted at timings as shown in FIG. 2A. Specifically, after a transmission for a longer period on the order of 500 μs (hereinafter, referred to as a "burst"), a transmission stop period on the order of 100 μs is provided. Thereafter, a transmission for a shorter period on the order of 50 μs (hereinafter, referred to as a "synchronous signal") and a transmission stop for a period on the order of 100 μs (reception period in the tablet) are repeated. At timings of eight-time shorter synchronous signals following the burst, binary-coded 8-bit operation information is detected by the tablet, as described later.

Figure 3:
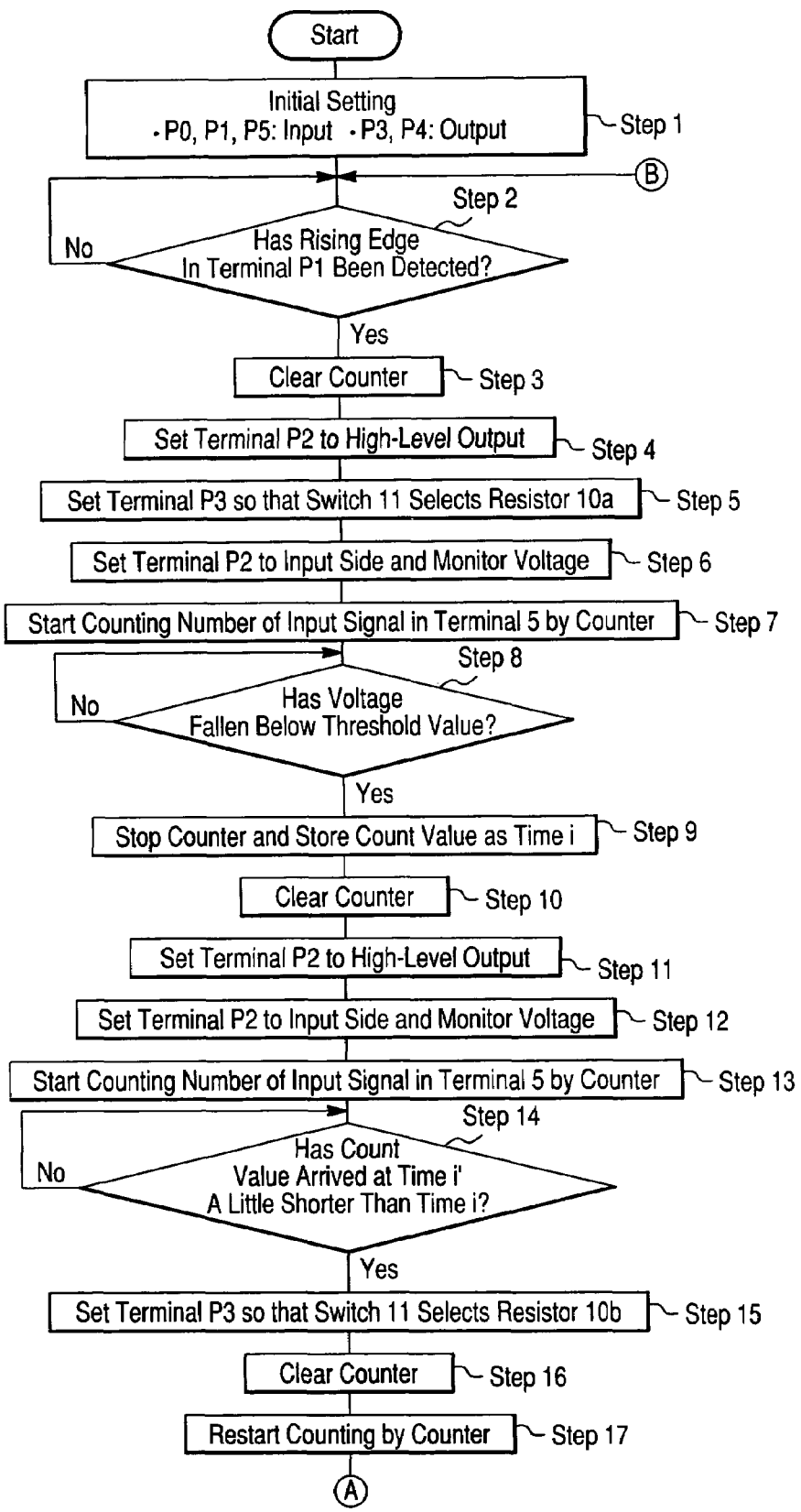
FIG. 3 is a flowchart showing operations of the first embodiment.
Figure 4:
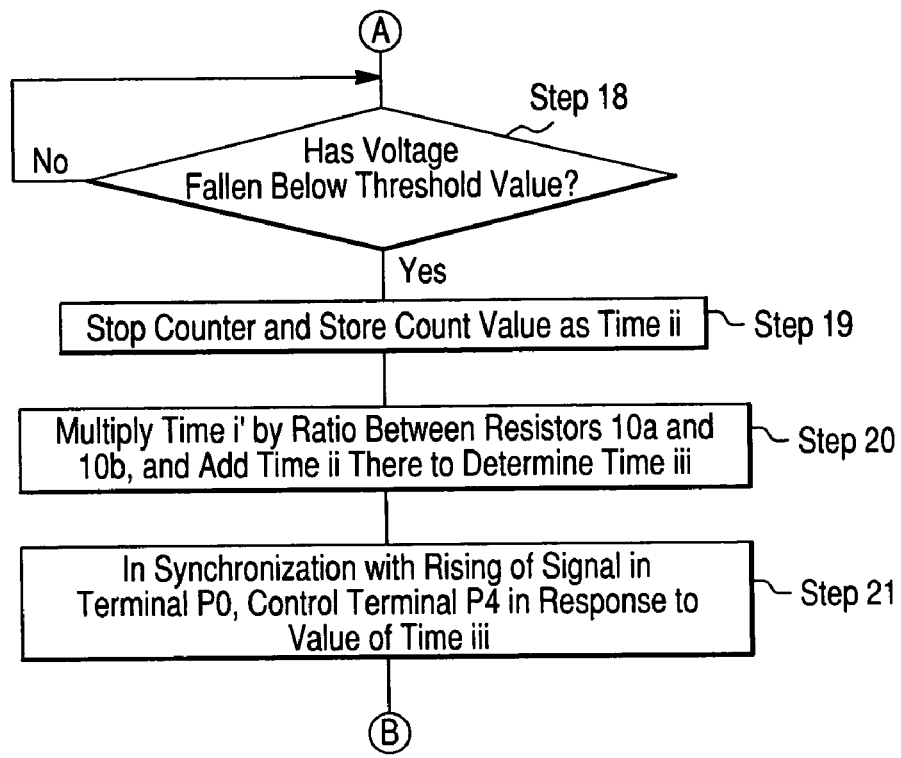
FIG. 4 is a flowchart showing operations of the first embodiment.

FIGS. 3 and 4 are flowcharts showing operation corresponding to the program of the microcomputer 12, in this embodiment. These operations are described in detail based on the flowcharts.

Once the position indicator of FIG. 1 has been placed onto the tablet, a signal is generated in the resonant circuit 1 by the signal from the tablet. The capacitor 4 is charged by the generated signal to provide a power source. Once the voltage has achieved or exceeded a specified voltage, the microcomputer 12 is brought into operation. First, the microcomputer 12 sets each of the terminals P0, P1, and P5 as an input, and sets each of the terminals P3 and P4 as an output (STEP 1). Then, upon detecting a rising edge (burst) of the signal from terminal P1 (STEP 2), the microcomputer 12 commences writing force detection processing.

The microcomputer 12 clears the counter (STEP 3), and sets the terminal P2 as a high-level output (STEP 4), thereby charging the variable capacitor 9 to a predetermines voltage. Also, the microcomputer 12 controls the terminal P3 so that the switch 11 selects the resistor 10a so as to be connected to the variable capacitor 9 (STEP 5).

Next, the microcomputer 12 sets the terminal P2 to the input side, and starts monitoring the voltage (STEP 6), as well as starts to count the number of waves of transmission signals inputted from the terminal P5 (STEP 7). With the terminal P2 set to the input side, electric charge stored in the variable capacitor 9 is discharged through the resistor 10a, and the terminal voltage gradually decreases as the discharge of the electric charge progresses.

Once the microcomputer 12 has detected the terminal voltage falling below a specified voltage (threshold value) (STEP 8), it stops the counting by a counter and holds the count value at this time as time i (STEP 9). Also, the count value of the counter is reset to 0 (STEP 10).

The microcomputer 12 again sets the terminal P2 to a high-level output (STEP 11), and charges the variable capacitor 9 to the predetermined voltage. Thereafter, the microcomputer 12 sets the terminal 2 to the input side, and starts monitoring the voltage (STEP 12), and restarts counting by the counter (STEP 13).

Once the count value of the counter has arrived at a time i' that is shorter than the preceding time i (STEP 14), the microcomputer 12 controls the terminal P3 so that the switch 11 selects the resistor 10b so as to be connected to the variable capacitor 9 (STEP 15). Then, the microcomputer 12 resets the count value of the counter to 0 (STEP 16), and restarts the counting (STEP 17). The rate of the voltage drop at this time is less steep than the case of the resistor 10a.

Once the microcomputer 12 has detected the terminal voltage falling below the threshold value (STEP 18), it stops the counting by the counter, and holds the count value at this time as a time ii (STEP 19).

After having completed the above-described writing force detection processing, the microcomputer 12 determines, by its internal calculation processing, the encoded operation information corresponding to the writing force on the basis of the time i' and the time ii.

Considering the time ii when the discharge by the resistor 10b is performed as a base, the discharge during the period of time i' is regarded as having been performed faster by the ratio of the resistance value between the resistors 10a and 10b. That is, assuming that the discharges are performed at equal speeds, the time can be regarded as having elapsed faster by the ratio of the resistance value between the resistors 10a and 10b. According to this way of thinking, it can be said that the counting during the period of time i' was performed relatively slowly. Hence, by multiplying the time i' by the ratio of the resistance value between the resistors 10a and 10b, it is possible to obtain a count value equivalent to that in the case where the discharge is performed for the period of time ii, i.e., it is performed through the resistor 10b. A time iii obtained by adding the above-described count value to the time ii becomes writing force detection information obtained with the same resolution as the case where the detection is performed by the large resistance 10b alone (STEP 20).

If the detection is performed only by the large resistance 10b, the time necessary for detection undesirably exceeds the burst period. In the present invention, therefore, the discharge is fast, performed during the time period before the terminal voltage gets close to the threshold value, thereby bringing about a situation such as if the time were caused to elapse fast. However, because the speed of counting by the counter for encoding the time remains unchanged, the counting at this period becomes relatively slow, so that the resolution disadvantageously decreases if things continue as they are. With this being the situation, in the vicinity of the threshold value, the counting speed is returned to the original speed so that the counting can be performed without reducing the resolution.

After completion of the burst period, the microcomputer 12 starts data transmission processing with respect to the tablet. Specifically, in synchronization with the rising of a signal of the terminal P0, which signal is a synchronous signal from the tablet, the microcomputer 12 controls the terminal P4 sequentially from the lowest-order bit of the count value (binary number) corresponding to time iii, and transmits it to the tablet (STEP 21).

Suppose an output "10101010" is obtained as the time iii. When transmitting the output from the lowest-order bit, since the first bit is "0", the microcomputer 12 does nothing with respect to the synchronous signal from the tablet. Next, since the second bit is "1", upon detecting the synchronous signal from the tablet, the microcomputer 12 controls the terminal P4 to turn on the switch 2, thereby short-circuiting the resonant circuit 1. This eliminates any signal in the resonant circuit 1, and the tablet detects this to thereby send back "1". Here, it is assumed that, when being subjected to an on-control, the switch 2 is returned to the off-position by the microcomputer 12 or an appropriate external circuit after a specified time (timed to a degree such as not to affect a next bit, e.g., timed on the order of 100 μs) has elapsed. Hereinafter, once bits have been sent back to the tablet up to the last bit in the same manner, the microcomputer 12 waits for the next burst period to restart the writing force detecting processing.

In the above-described first embodiment, the processing of STEPs 4, 5, 11, and 15 constitutes discharging/charging means, the processing of STEPs 3 to 9 constitutes time measuring means, the processing of STEP 5 and STEPs 10 to 19 constitute time-constant setting means, the processing of STEPs 10, 13, 16, 17, and 19 constitute counting means, and the processing of STEP 20 constitutes calculating means.

In the above-described embodiment, the number of resistors may be three or more. Also, objects that the counter inside the microcomputer 12 counts may include clock signals of the microcomputer 12. The changeover of the resistance value may be made based on whether, with respect to resistors continuously connected to the variable capacitor, another resistor is to be connected in parallel.

Figure 5:
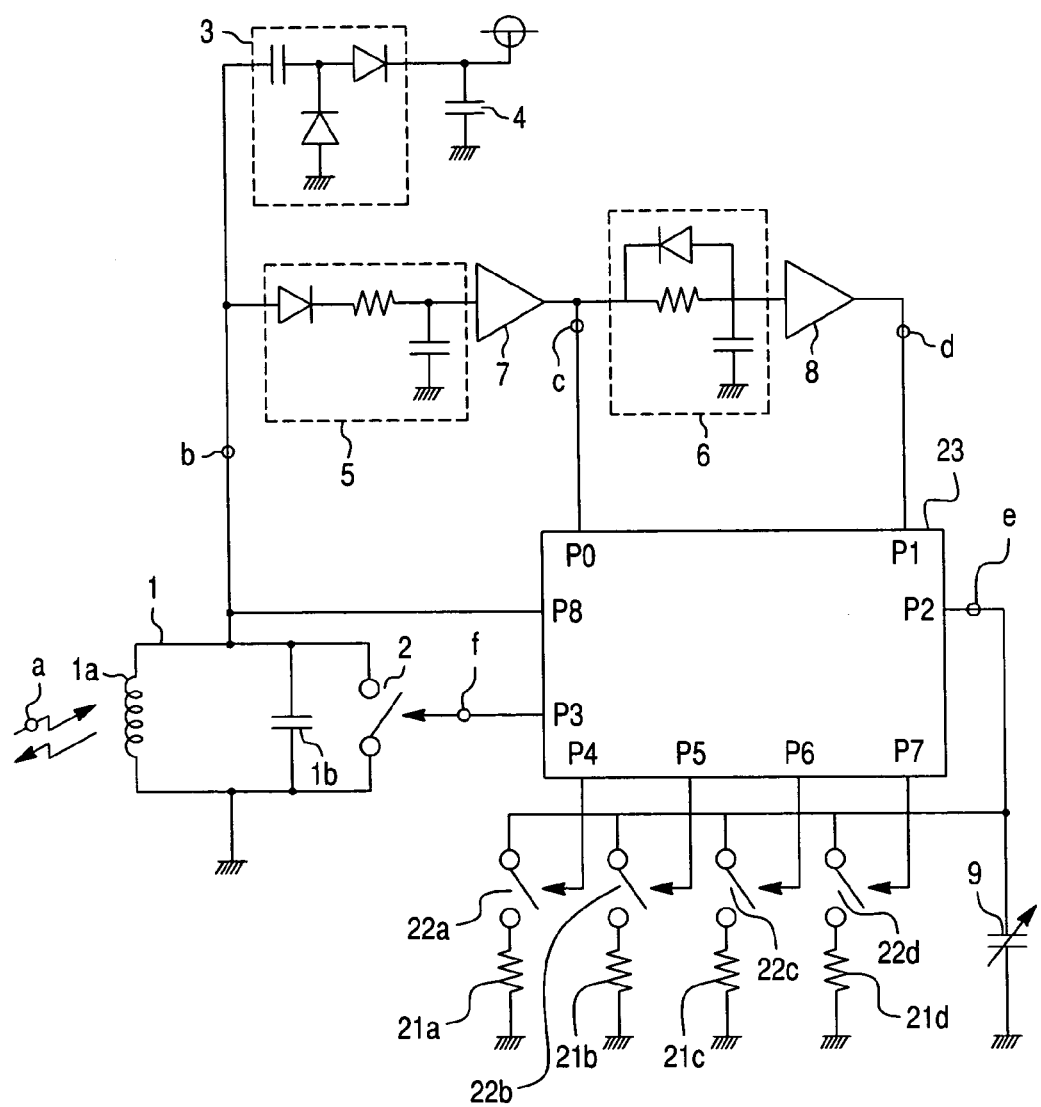
FIG. 5 is a block diagram of a position indicator according to a second embodiment of the present invention.

FIG. 5 shows a position indicator according to a second embodiment of the present invention. In FIG. 5, the same components as those in the first embodiment are designated by the same reference numerals. Reference numeral 1 denotes a resonant circuit; 2 a switch; 3 a power source extraction circuit; 4 a capacitor as the power source; 5 is a detector circuit; 6 is an integration circuit; 7 and 8 denote buffers; 9 denotes a variable capacitor; 21a, 21b, 21c, and 21d denote resistors; 22a, 22b, 22c, and 22d are changeover switches; and 23 denotes a microcomputer.

The resistors 21a, 21b, 21c, and 21d have resistance values two times, four times, and eight times as large as the resistors 21b, 21c, and 21d respectively. That is, the resistors 21a, 21b, 21c, and 21d are such that their resistance values vary by a factor of $2^N$ (N is a natural number not less than 1). The switches 22a, 22b, 22c, and 22d are each controlled by the microcomputer 23 to perform on/off operations, and switch and connect any one of the resistors 21a to 21d to the opposite ends of the variable capacitor 9.

Here, the variable capacitor 9, the resistors 21a to 21d, and the switches 22a to 22d constitute the time-constant circuit.

As in the case of the microcomputer 12 in the first embodiment, the microcomputer 23 is a well-known microcomputer, which includes a ROM and a RAM, and which operates in accordance with programs written in the ROM. In this embodiment, out of the input/output terminals provided in the microcomputer 23, nine are used as shown in FIG. 5.

Specifically, terminal P0 is set as an input terminal, and supplies signals from the buffer 7. Terminal P1 is also set as an input terminal, and supplies signals from the buffer 8. Terminal P2 is connected to the variable capacitor 9, and set as an output terminal to charge the variable capacitor 9. Also, the terminal P2 is set as an input terminal to detect the voltage of the variable capacitor 9 (time-constant circuit). Terminal P3 is set as an output terminal, and is connected to a switch 2 to on/off control the switch 2. Terminals P4, P5, P6, and P7 are set as output terminals, and connected to the switches 22a, 22b, 22c, and 22d, respectively, to on/off control these switches. Also, a terminal P8 is set as an input terminal, and connected to the resonant circuit 1. The terminal P8 counts the number of waves of transmission signals of the tablet, obtained from the resonant circuit 1, using an incorporated timer (counter).

In the microcomputer 23, a memory for storing 4 bits of binary-coded operation information is secured to meet the output, and the addresses therein are defined as addresses 1 to 4. There is one-to-one correspondence between the addresses 1 to 4 in the memory, the resistors 21a to 21d, and the switches 22a to 22d, respectively. In other words, the resistor 21a and the switch 22a correspond to the address 1, the resistor 21b and the switch 22b correspond to the address 2, the resistor 21c and the switch 22c correspond to the address 3, and the resistor 21d and the switch 22d correspond to the address 4.

Next, operation of the position indicator with these features according to the second embodiment will be described. FIGS. 6A to 6F are waveform diagrams illustrating operation of the second embodiment. Here, symbols "a" to "f" in FIGS. 6A to 6F denote signal waveforms of the respective portions denoted by the same symbols as those in FIG. 5.

From the tablet for detecting operation information represented as a continuous quantity in the position indicator, electromagnetic waves are transmitted at timings as shown in FIG. 6A. Specifically, after a transmission for a relatively longer period, on the order of 500 μs (hereinafter, referred to as a "burst"), a transmission stop period on the order of 100 μs is provided. Then, a transmission for a shorter period, on the order of 50 μs (hereinafter, referred to as a "synchronous signal"), and a transmission stop for a period on the order of 100 μs (reception period in the tablet) are repeated. At timings of four-time shorter synchronous signals following the burst, binary-coded 4-bit operation information is detected by the tablet as described later.

Figure 7:
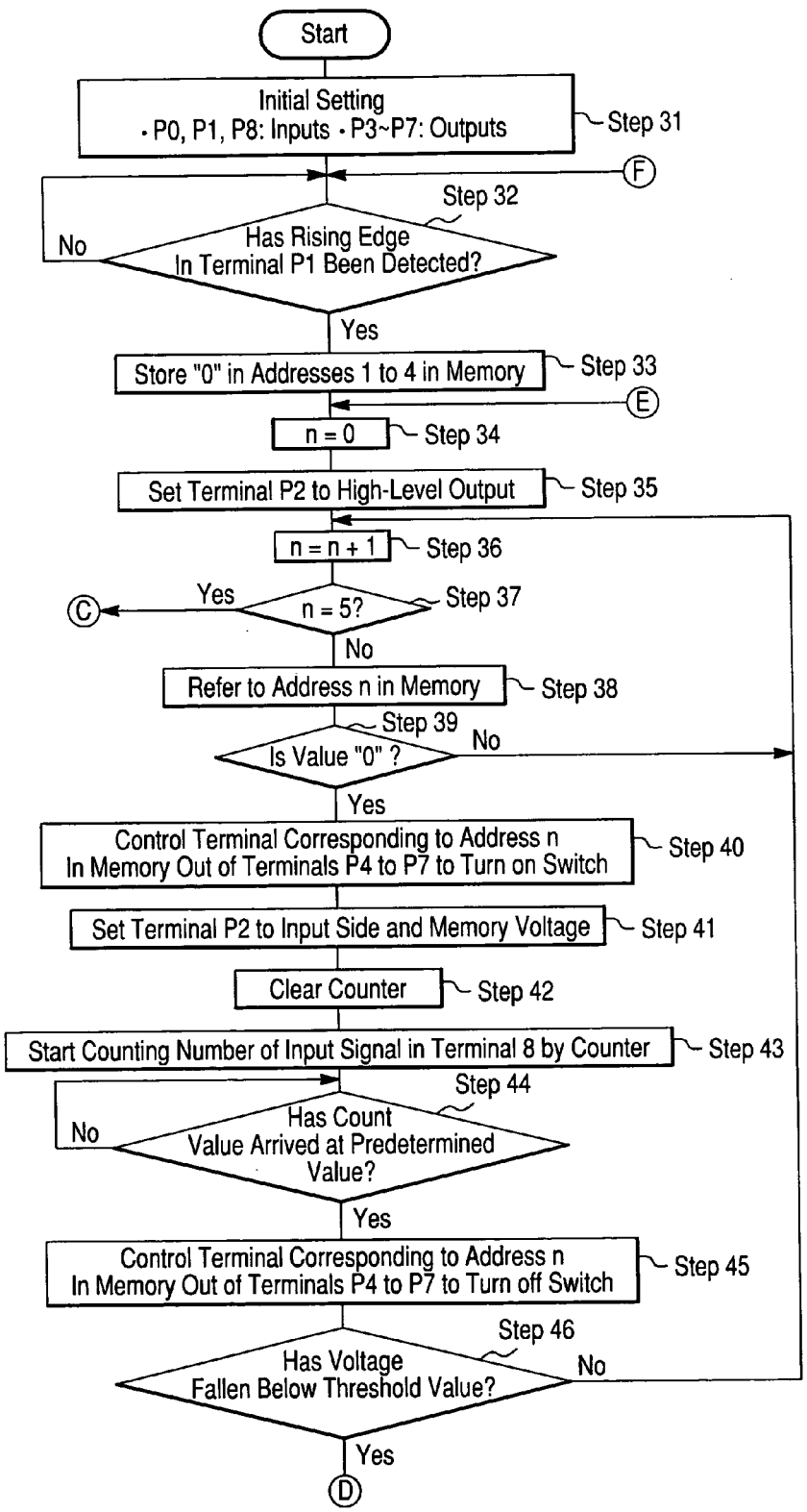
FIG. 7 is a flowchart showing operations of the second embodiment.
Figure 8:
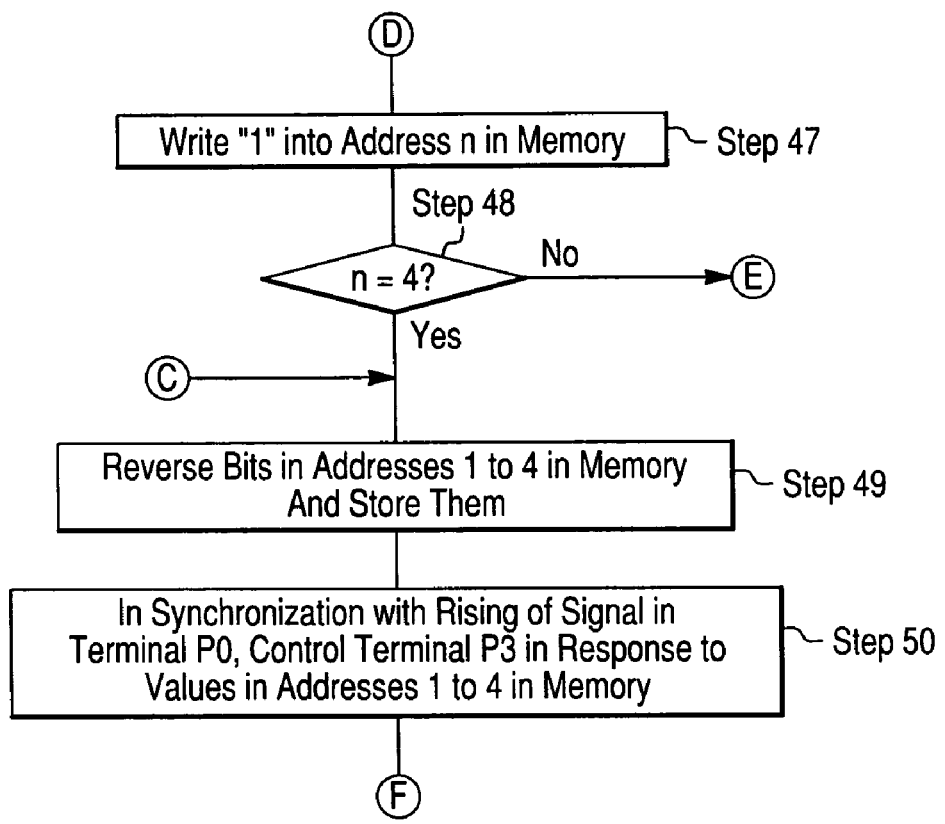
FIG. 8 is a flowchart showing operations of the second embodiment.

FIGS. 7 and 8 are flowcharts showing operations corresponding to the program of the microcomputer 23 in this embodiment. These operations are described in detail on the basis of the flowcharts.

Once the position indicator has been placed on the tablet, a signal is generated in the resonant circuit 1 by the signal from the tablet. The capacitor 4 is charged by this signal to act as the power source, and after the voltage has achieved or exceeded a specified voltage, the microcomputer 23 is brought into operation. First, the microcomputer 23 sets each of the terminals P0, P1, and P8 as an input, and sets each of the terminals P3 to P7 as an output (STEP 31). Then, upon detecting a rising edge (burst) of the signal from the terminal P1 (STEP 32), the microcomputer 12 starts writing force detection processing. At this point in time, in the memory to store the operation information, "0" is stored in each of the addresses 1 to 4 (STEP 33).

The microcomputer 23 sets the variable n for representing the address in the memory to 0 (STEP 34), and sets the terminal P2 to a high-level output (STEP 35), thereby charging the variable capacitor 9 up to a predetermined voltage. Furthermore, the microcomputer 23 refers to the memory sequentially from the address 1, and performs processing for finding the address in which the value initially was "0" (STEPs 36 to 39), and controls the terminal corresponding to the address in which the value was initially "0" out of the terminals P4 to P7 to turn on the switch (STEP 40). More specifically, when the address in which the value was initially "0" is the address 1, the microcomputer 23 controls the switch 22a to be turned on, thereby connecting the resistor 21a. When the address in which the value was initially "0" is an address 2, the microcomputer 23 controls the switch 22b to be turned on, thereby connecting the resistor 21b.

Next, the microcomputer 23 sets the terminal P2 to the input side, and starts monitoring the voltage (STEP 41). Also, the microcomputer 23 clears the counter (STEP 42), and starts counting the number of waves of transmission signals inputted from the terminal P8 (STEP 43). With the terminal P2 being set to the input side, electric charge stored in the variable capacitor 9 is discharged through a resistor, such as 21a, and the terminal voltage gradually decreases as the discharge of the electric charge progresses.

At the point in time when the count value by the counter has arrived at a predetermined value corresponding to a specified unit time (STEP 44), the microcomputer 23 causes the switch that has been turned on in STEP 40 to be turned off (Step 45), and detects whether the voltage at the terminal P2 has fallen below a specified voltage i.e., a threshold value (STEP 46).

If the voltage at the terminal P2 has not fallen below the threshold value, the microcomputer 23 continues the above-described reference to the memory for the next address, and similarly controls the terminal corresponding to the address in which the value was initially "0" to turn on the switch (STEPs 36 to 40).

On the other hand, if the voltage at the terminal P2 has fallen below the threshold value, the microcomputer 23 stores "1" into a current address in the memory (STEP 47).

The microcomputer repeats the above-described processing until a subsequent address becomes nonexistent in the reference to the memory, namely, the reference to the address 4 in the memory is completed (STEP 37) or processing corresponding to the address 4 is completed (STEP 48).

Figure 6:
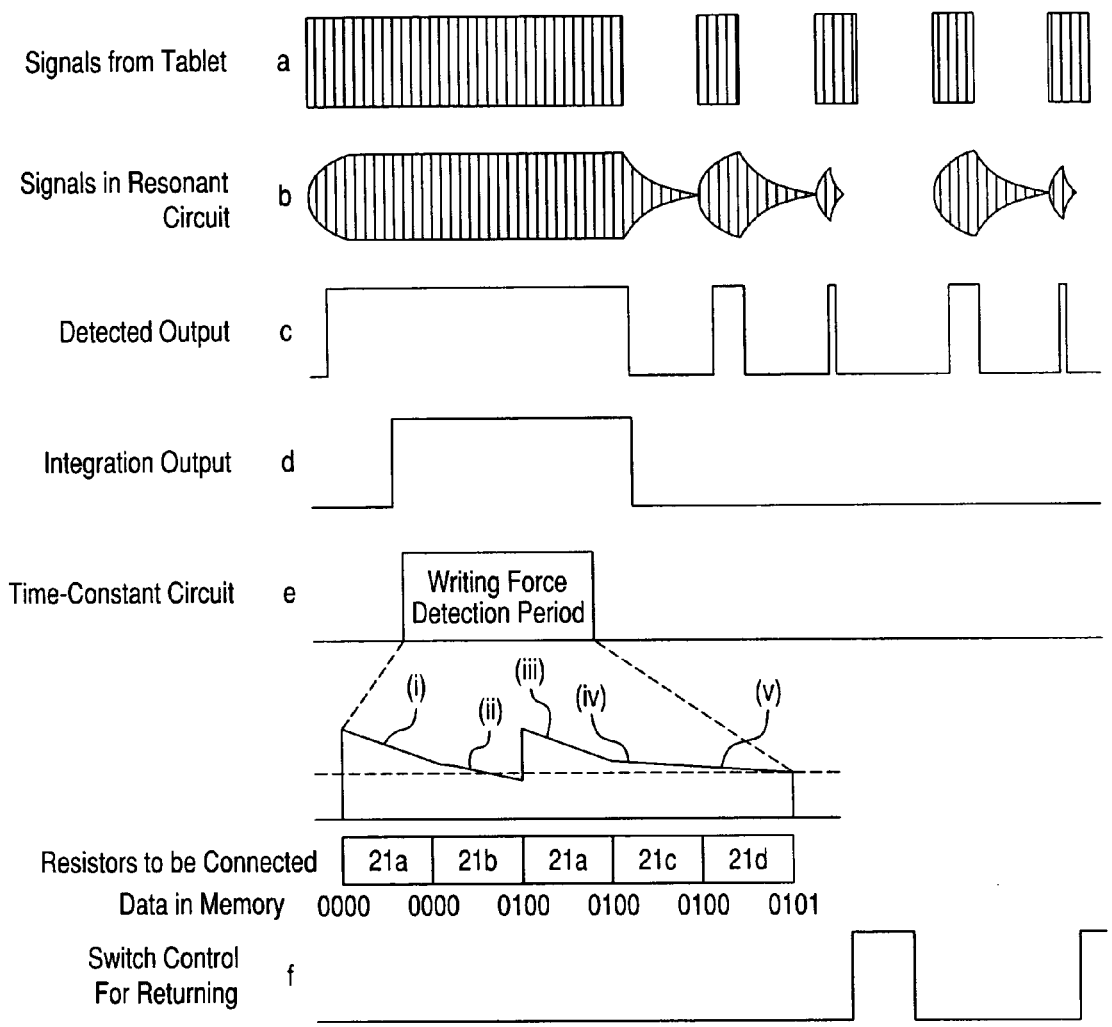
FIGS. 6A to 6F are waveform diagrams showing operations in the second embodiment.

In the example shown in FIG. 6, the operational flow follows. The processing of STEPs 34 to 39 are performed. In the first STEP 34, because the address 1 is "0", the resistor 21a is connected by the pertinent switch 22a, and the voltage gradually decreases ((i) in FIG. 6). Then, the processing of STEPs 40 to 46 with respect to the address 1 is performed. Because it is found in STEP 46 that the voltage has not fallen below the threshold value, the proceeding returns to STEP 36. Next, the resistor 21b related to the address 2 in which "0" is found is connected, and likewise, the voltage gradually decreases ((ii) in FIG. 6). Now that the voltage has fallen below the threshold value, the processing advances to STEP 47, where "1" is stored into the address 2. Then, the processing returns to STEP 34.

The processing of STEPs 34 to 39 are again performed. The processing of STEPs 40 to 46 with respect to the address 1 are similarly performed ((iii) in FIG. 6). Because the address 2 has "1" stored therein, it is skipped. Then, the resistor 21c corresponding to the address 3 is connected, and the voltage gradually decreases in a similar way ((iv) in FIG. 6). Because the voltage has not fallen below the threshold value, the processing returns to STEP 36, and then the processing of STEPs 40 to 46 with respect to the address 4 is performed ((v) in FIG. 6). Now that the voltage has fallen below the threshold value, the processing advances to STEP 47. At the point in time when "1" is stored in the address 4, the processing corresponding to the address 4 is completed, thereby completing the detection. Thus, the memory stores "0101" sequentially from the address 1.

The data in the memory obtained in this way provides operation information in which a writing force has been binary-coded if the data is sequentially arranged with the address 1 taken as the highest-order bit. In this case, however, the stronger the writing force, a lower value is outputted. Therefore, in order that the operation information appear more natural, all bits are reversed (STEP 49). Thus, after having been made larger as the writing force becomes stronger, the output is returned to the tablet. In this example, "1010" is returned.

After the burst period has finished, the microcomputer 23 starts data transmission processing with respect to the tablet. Specifically, in synchronization with the rising of the signal of the terminal P0, which signal is a synchronous signal from the tablet, the microcomputer 23 controls the terminal P3 sequentially from the lowest-order bit of the above-described operation information, and transmits it to the tablet (STEP 50).

Suppose the operation information is "10101010". When transmitting it from the lowest-order bit, because the first bit is "0", the microcomputer 23 does nothing with respect to the synchronous signal from the tablet. Next, because the second bit is "1", upon detecting the synchronous signal from the tablet, the microcomputer 23 controls the terminal P3 to turn on the switch 2, thereby short-circuiting the resonant circuit 1. This eliminates any signal in the resonant circuit 1, and the tablet detects this to thereby send back "1". Here, it is assumed that when being subjected to an on-control, the switch 2 is returned to the off-position by the microcomputer 23 or an appropriate external circuit after a specified time (timed to a degree such as not to affect the next bit, e.g., timed on the order of 100 µs) has elapsed. Hereinafter, once bits have been sent back to the tablet up to the last bit in the same manner, the microcomputer 23 waits for a next burst period, and then restarts the writing force detecting processing.

In the above-described second embodiment, the processing of STEPs 35, 40, and 45 constitutes discharging/charging means, the processing of STEPs 42 to 44 constitutes counting means, the processing of STEPs 34 to 48 constitutes time-constant setting means, and the processing of STEPs 33 and 47 constitutes calculating means.

In the above-described embodiment, the number of combined resistors and switches to be connected to the input/output terminals of the microcomputer may be increased to perform detection with high resolution. Also, the counter in the microcomputer may be a type that counts clock signals from the microcomputer.

Tablets to be used in the first and second embodiments may include those that detect information, such as an operation, as a signal level on the basis of the presence/absence of a signal from the position indicator. For example, as such, there are arrangements that are disclosed in the first embodiment in Japanese Unexamined Patent Application Publication No. 8-171448, and in Japanese Unexamined Patent Application Publication No. 8-30374.

Figure 9:
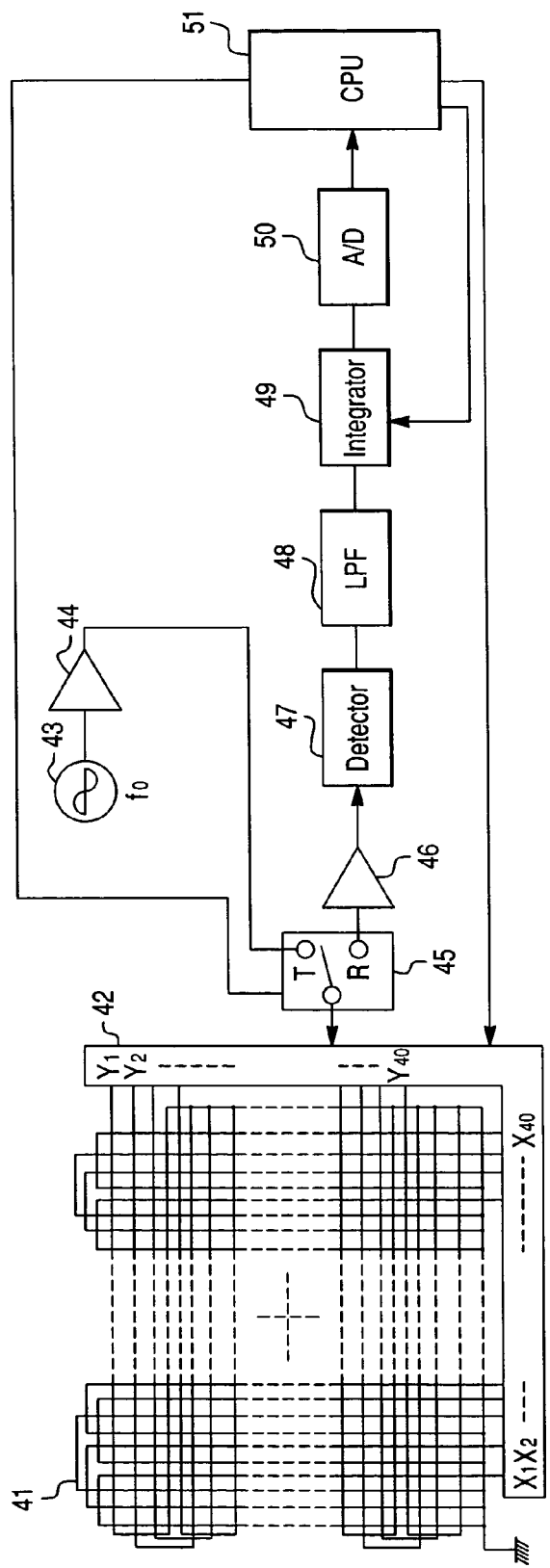
FIG. 9 is a block diagram of a position detector (tablet) according to an embodiment of the present invention.

FIG. 9 illustrates an embodiment of the invention, except for the position indicator, in the position detector according to the present invention, that is, the tablet.

In FIG. 9, reference numeral 41 denotes a loop coil group, which is arranged as X1 to X40 and Y1 to Y40, in an X-axis direction and a Y-axis direction, respectively. These loop coils are connected to a selection circuit 42 for selecting each of the loop coils.

Reference numeral 43 denotes an oscillation circuit that oscillates at a resonant frequency of the resonant circuit 1 of the above-described position indicator 1, which frequency is, for example, the same frequency as the frequency $f_0$ of electromagnetic waves transmitted from a tablet. The resonant circuit 43 is connected to the transmission side (T) of a transmission/reception switching circuit 45 via a current driver 44. The transmission/reception switching circuit 45 is connected to the selection circuit 42, and electromagnetic waves at the frequency $f_O$ are emitted from the selected loop coil to the position indicator 1.

The reception side (R) of the transmission/reception switching circuit 45 is connected to an amplifying circuit 46, which is connected to a detector circuit 47. The detector circuit 47 is connected to a low-pass filter (LPF) 48, which is connected to an integration amplifier 49, and stores and holds reception signals for a specified time. The voltage held by the integration amplifier 49 is outputted to an A/D conversion circuit 50, the output of which is connected to a CPU (central processing unit) 51.

The CPU 51 issues a control signal (information) to each of the selection circuit 42, the transmission/reception switching circuit 45, the integration amplifier 49, and the A/D conversion circuit 50.

The operation mode of the tablet is broadly divided into two categories: an overall scan mode in which electromagnetic waves are transmitted/received while sequentially switching all members of two groups of loop coils in the X-axis direction and the Y-axis direction (in groups of forty), in which it is determined whether a signal level of not less than a predetermined value is received, and in which a loop coil having the highest signal level, i.e., a-peak coil, is extracted with respect to each of the X-axis and the Y-axis directions; and a partial scan mode as described later.

In the overall scan mode, a signal level of not less than the predetermined value is received, and this processing is repeated until the peak coil is extracted. After the signal level of not less than the predetermined value has been received and the peak coil has been extracted, the overall scan mode is transferred to the partial mode. This partial mode is repetitively performed until the time comes when a signal level of not less than the predetermined value is not received. In the partial mode, when the time comes when a signal level of not less than the predetermined value is not received, the partial mode is again transferred to the overall mode. These procedures are repeated in this manner.

The partial scan mode is further divided into a burst period, an operation information detecting period, a Y-axis coordinate detecting period, and an X-axis coordinate detecting period.

During the burst period and the operation information detecting period, a peak coil is selected (either one of the peak coils in the X-axis and Y-axis coils may be selected) by the selection circuit 42. Using the transmission/reception switching circuit 45, the above-described transmission/reception of electromagnetic waves, that is, a transmission for a relatively longer period on the order of 500 $\mu$s, a transmission stop for a period on the order of 100 $\mu$s, a subsequent transmission for a shorter period on the order of 50 $\mu$s, and a transmission stop for a period on the order of 100 $\mu$s (reception period), are repeated a plurality of times (eight times for the position indicator in the first embodiment, and four times for the position indicator in the second embodiment), and thereby operation information from the position indicator is received.

Also, during the X-axis coordinate detecting period and the Y-axis coordinate detecting period, using the selection circuit 42, a plurality of (e.g., five) loop coils, mainly peak coils, are selectively switched in succession, and transmission/reception of electromagnetic waves comprising a transmission for a shorter period on the order of 50 $\mu$s, and a transmission stop for a period on the order of 100 $\mu$s (reception period), which are the same as the foregoing, is performed with respect to the position indicator by the transmission/reception switching circuit 45, thereby obtaining signals for detecting the X-axis and the Y-axis coordinates. Here, the calculation processing for detecting coordinates is the same as that in conventional devices for calculation processing, and the calculated coordinates in the X-axis and the Y-axis directions are transferred to a higher level device together with the above-described operation information.

I claim:

1. A position indicator that converts operation information represented as a continuous quantity into the length of time, that codes the length of time by counting the number of alternating current signals at a specified frequency, and that transfers the operational information represented as the continuous quantity to the side of a tablet by varying signals to be sent to the tablet side in accordance with the code, the position indicator comprising:

a time-constant circuit that includes an element of which the characteristic continuously varies in response to an operation represented as a continuous quantity, and that can switch the variation range of a time constant in response to the variation in the characteristic of the element in at least two ways; and discharging/charging means capable of discharging the time-constant circuit from a predetermined voltage to a voltage below a specified voltage, or charging the time-constant circuit from the predetermined voltage to a voltage exceeding the specified voltage, wherein, using the time-constant circuit and the discharging/charging means, the number of waves of alternating current signals at the specified frequency is counted from the time of a discharge start to the time when the voltage falls below the specified voltage, or from the time of a charge start to the time when the voltage exceeds the specified voltage, by switching the variation range of the time constant.

2. A position indicator that converts operation information represented as a continuous quantity into the length of time, that codes the length of time by counting the number of alternating current signals at a specified frequency, and that transfers the operational information represented as the continuous quantity to the side of a tablet by varying signals to be sent to the tablet side in accordance with the code, the position indicator comprising:

a time-constant circuit that includes an element of which the characteristic continuously varies in response to an operation represented as a continuous quantity, and that can switch the variation range of a time constant in response to the variation in the characteristic of the element in at least two ways;

discharging/charging means capable of discharging the time-constant circuit from a predetermined voltage to a voltage below a specified voltage, or charging the time-constant circuit from the predetermined voltage to a voltage exceeding the specified voltage; and time-constant setting means that, during the period from the time of a discharge start to the time when the voltage falls below the specified voltage, or from the time of a charge start to the time when the voltage exceeds the specified voltage, switches the time constant in at least two ways for setting, wherein, using the time-constant circuit and the discharging/charging means, the number of waves of alternating current signals at the specified frequency is counted over the period from the time of a discharge start to the time when the voltage falls below the specified voltage, or from the time of a charge start to the time when the voltage exceeds the specified voltage, for every period during which the variation range of the time constant is switched.

3. A position indicator that converts operation information represented as a continuous quantity into the length of time, that codes the length of time by counting the number of alternating current signals at a specified frequency, and that transfers the operational information represented as the continuous quantity to the side of a tablet by varying signals to be sent to the tablet side in accordance with the code, the position indicator comprising:

a time-constant circuit that includes an element of which the characteristic continuously varies in response to an operation represented as a continuous quantity, and that can switch the variation range of a time constant in response to the variation in the characteristic of the element in at least two ways;

discharging/charging means capable of discharging the time-constant circuit from a predetermined voltage to a voltage below a specified voltage, or charging the time-constant circuit from the predetermined voltage to a voltage exceeding the specified value;

time-constant setting means that, during the period from the time of a discharge start to the time when the voltage falls below the specified voltage, or from the time of a charge start to the time when the voltage exceeds the specified value, switches the time constant in at least two ways for setting;

counting means that counts the number of waves of alternating current signals at the specified frequency, over the period from the time of a discharge start to the time when the voltage falls below a specified value, or from the time of a charge start to the time when the voltage exceeds the specified value, for every period during which the variation range of the time constant is switched; and calculating means that, on the basis of the ratio between the count value of alternating current signals at the specified frequency during each of the periods and the variation range of the time constant during each of the periods, determines a count value corresponding to that in the case where the variation range of the time constant in the all periods is assumed to be the largest variation range of the time constant out of at least two ways of variation ranges of the time constant, and that takes the count value as said code.

4. The position indicator according to claim 3, wherein the time-constant setting means is used that initially set the variation range of the time constant in the time-constant circuit to a first variation range to thereby start a discharge or a charge from the predetermined voltage, and that, at the time after a predetermined time has elapsed, switches the variation range of the time constant from the first variation range to a second variation range that is sufficiently larger than the first variation range, for setting.

5. The position indicator according to claim 3, further comprising:

time measuring means that, in a state where the variation range of the time-constant circuit continues to be set at the first variation range, measures time required to discharge the time-constant circuit from the predetermined voltage to a voltage below the specified voltage, or charge the time-constant circuit from the predetermined voltage to a voltage excessing the specified voltage, wherein time-constant setting means is used that initially set the variation range of the time constant in the time-constant circuit to the first variation range to thereby start a discharge or a charge from the predetermined voltage, and that, at the time after time a little shorter than the measured time has elapsed, switches the variation range of the time constant from the first variation range to a second variation range that is sufficiently larger than the first variation range, for setting.

6. The position indicator according to claim 3, wherein the time-constant circuit comprises:

a variable capacitor of which the capacity value continuously varies in response to an operation represented as a continuous quantity;

at least two resistors different in the resistance value from each other; and switching connection means capable of switching and connecting each of the resistors to the variable capacitor.

7. A position indicator that converts operation information represented as a continuous quantity into the length of time, that codes the length of time by counting the number of alternating current signals at a specified frequency, and that transfers the operational information represented as the continuous quantity to the side of a tablet by varying signals to be sent to the tablet side in accordance with the code, the position indicator comprising:

a time-constant circuit that includes an element of which the characteristic continuously varies in response to an operation represented as a continuous quantity, and that can switch the variation range of a time constant in response to the variation in the characteristic of the element in n ways in each of which the characteristic varies by a factor of $2^N$, wherein n is a natural number not less than 2, and N is a natural number not less than 1; and discharging/charging means capable of discharging the time-constant circuit from a predetermined voltage to a voltage below a specified voltage, or charging the time-constant circuit from the predetermined voltage to a voltage exceeding the specified voltage, wherein:

the variation range of the time constant in the time-constant circuit is set to the smallest variation range, and a discharge or a charge is started from the predetermined voltage;

thereafter, for every specified unit time obtained by counting a predetermined number of waves of alternating signals at the specified frequency, the variation range of the time constant in the time-constant circuit is switched and set from the smallest variation range up to the largest variation range;

when the voltage at the time point when a mid-course unit time has elapsed has fallen below the specified voltage, or has exceeded the specified voltage, a discharge or a charge and switching setting that are the same as the foregoing are repeated with respect to the variation ranges except the variation range of the time constant at said time point; and a bit string in which the variation range of the time constant corresponding to that in the case where the voltage has fallen below the specified value or has exceeded the specified value, is represented by a bit "1", and in which the other variation range of the time constant is represented by a bit "0", is taken as said code (or alternatively, a bit string in which the variation range of the time constant corresponding to that in the case where the voltage has fallen below the specified value or has exceeded the specified value, is represented by a bit "0", and in which the other variation range of the time constant is represented by a bit "1", is taken as said code).

8. A position indicator that converts operation information represented as a continuous quantity into the length of time, that codes the length of time by counting the number of alternating current signals at a specified frequency, and that transfers the operational information represented as the continuous quantity to the side of a tablet by varying signals to be sent to the tablet side in accordance with the code, the position indicator comprising:

a time-constant circuit that includes an element of which the characteristic continuously varies in response to an operation represented as a continuous quantity, and that can switch the variation range of a time constant in response to the variation in the characteristic of the element in n ways in each of which the characteristic varies by a factor of $2^N$ wherein n is a natural number not less than 2, and N is a natural number not less than 1; and discharging/charging means capable of discharging the time-constant circuit from a predetermined voltage to a voltage below a specified voltage, or charging the time-constant circuit from the predetermined voltage to a voltage exceeding the specified voltage;

counting means for measuring a specified unit timely counting a predetermined number of waves of alternating current signals at a specified frequency;

time-constant setting means in which:

when switching and setting the variation range of the time constant in the time-constant circuit from the smallest variation range up to the highest variation range, the variation range is initially set to the smallest variation range and a discharge or a charge is started from the predetermined voltage;

thereafter, when the voltage at the time point when the unit time has elapsed for each the unit time has not fallen below a specified voltage, or has not exceeded the specified voltage, switching and setting are successively performed; and when the voltage at the time point when a mid-course unit time has elapsed has fallen below a specified voltage, or has exceeded the specified voltage, then, with respect to the variation ranges of the time constant from the smallest variation range up to the largest variation range out of the variation ranges of the time constant except the variation range of the time constant at said time point, the variation range of the time constant in the time-constant circuit is initially set to the smallest variation range, then a discharge or a charge is restarted from the predetermined voltage, and the same switching setting as the foregoing is repeated until the largest variation range is set; and recording means that records, as said code, a bit string in which the variation range of the time constant corresponding to that in the case where the voltage has fallen below the specified value or has exceeded the specified value in the time-constant setting mean, in the order from the smallest variation range to the highest variation range or in the inverse order, with respect to the n ways of variation ranges of the time constant, is represented by a bit "1", and in which the other variation range of the time constant is represented by a bit "0" (or alternatively, a bit string in which the variation range of the time constant corresponding to that in the case where the voltage has fallen below the specified value or has exceeded the specified value, is represented by a bit "0", and in which the other variation range of the time constant is represented by a bit "1").

9. The position indicator according to claim 8, wherein the time-constant circuit comprises:

a variable capacitor of which the capacity value continuously varies in response to an operation represented as a continuous quantity;

n resistors of which the resistance values varies by a factor of $2^N$; and switching connection means capable of switching and connecting each of the resistors to the variable capacitor.

10. The position indicator according to claim 1, wherein, when the position indicator includes a resonant circuit, alternating current signals generated in the resonant circuit by alternating current electromagnetic waves at a specified frequency that are transmitted from the tablet to the position indicator, are used as alternating current signals at the specified frequency.

11. A position detector comprising:

a position indicator;

a tablet that determines the coordinate values of an indicated position by the position indicator, that receives signals obtained by coding operation information represented as a continuous quantity transmitted from the position indicator, and that transfers said signals together with the coordinate values of the indicated position to a higher level device, wherein, as the position indicator, the position detector uses the position indicator as recited in claim 1.

12. A method of operating a position indicator that converts operation information represented as a continuous quantity into the length of time, that codes the length of time by counting the number of alternating current signals at a specified frequency, and that transfers the operational information represented as the continuous quantity to the side of a tablet by varying signals to be sent to the tablet side in accordance with the code, comprising the steps of:

Providing a time-constant circuit that includes an element of which the characteristic continuously varies in response to an operation represented as a continuous quantity, and that can switch the variation range of a time constant in response to the variation in the characteristic of the element in at least two ways;

providing a discharge/charging means and discharging the time-constant circuit from a predetermined voltage to a voltage below a specified voltage, or charging the time-constant circuit from the predetermined voltage to a voltage exceeding the specified voltage; and using the time-constant circuit and the discharging/charging means, the number of waves of alternating current signals at the specified frequency is counted from the time of a discharge start to the time when the voltage falls below the specified voltage, or from the time of a charge start to the time when the voltage exceeds the specified voltage, by switching the variation range of the time constant.

* * * * *